United States Patent [19]
Lazarus et al.

[11] Patent Number: 6,024,340
[45] Date of Patent: Feb. 15, 2000

[54] VALVE ASSEMBLY

[75] Inventors: Kenneth B. Lazarus, Concord; Erik Saarmaa, Cambridge; Jeffrey W. Moore, Arlington; James Newman, Sudbury, all of Mass.

[73] Assignee: Active Control Experts, Inc., Cambridge, Mass.

[21] Appl. No.: 08/760,607

[22] Filed: Dec. 4, 1996

[51] Int. Cl.[7] .................................................. F16K 31/02
[52] U.S. Cl. ..................... 251/129.06; 310/330; 310/365
[58] Field of Search .................... 251/129.06, 129.01; 137/83; 310/311, 330, 365

[56] References Cited

U.S. PATENT DOCUMENTS

| | | |
|---|---|---|
| 4,417,170 | 11/1983 | Benincasa . |
| 4,633,122 | 12/1986 | Radice . |
| 4,963,954 | 10/1990 | Hälg et al. . |
| 5,012,835 | 5/1991 | Ikehata et al. ................. 251/129.06 X |
| 5,460,202 | 10/1995 | Hanley et al. . |

FOREIGN PATENT DOCUMENTS

| | | |
|---|---|---|
| 31 50 696 A1 | 6/1983 | Germany . |
| 32 23 801 A1 | 12/1983 | Germany . |
| 39 02 738 A1 | 5/1990 | Germany . |
| 62-4902 | 1/1987 | Japan ................................ 251/129.06 |
| 62-246667 | 10/1987 | Japan ................................ 251/129.06 |
| 1170202 | 7/1985 | U.S.S.R. ........................... 251/129.06 |
| WO 87/02514 | 4/1987 | WIPO . |
| WO 95/20827 | 8/1995 | WIPO . |

*Primary Examiner*—Kevin Lee
*Attorney, Agent, or Firm*—Testa, Hurwitz & Thibeault LLP

[57] ABSTRACT

A valve assembly includes a flexible sheet actuator in which two piezo sheets are stacked and actuated in opposite senses to form a bending assembly. The inner faces of the first and second sheets of piezoelectric material are laminated to respective conductive lead paths on opposite sides of a two-sided flex circuit, and the outer faces of the sheets of material are each covered by and electrically contacted to another flex circuit to produce a totally enclosed flat bender. At least a portion of the flex circuits extend away from the bender to provide a flexible and robust conductive lead-in thereto. The electrical connection is a flat ribbon-like strip of lesser thickness than the bender, and may pass hermetically between a gasketed or sealed face and cover plate of the valve. The middle layer of the bender construction is an insulating film, and a narrow lead pattern on each side of the film provides an extended electrode contact path to each of the opposing piezo sheets while allowing the two sheets to act against each other through the film, achieving a high level of bending actuation. The actuator is an essentially planar assembly which both insulates the piezo electric elements and allows them to be cantilevered from a housing with a simple flat clamping plate. The electrode paths extending outside the clamped region may connect to one or more adjacent piezo elements, forming a multi-actuator strip assembly. Holes are punched through the assembly away from the piezo elements or lead paths to provide registration or to accommodate mounting bolts.

18 Claims, 4 Drawing Sheets

VALVE ASSEMBLY

BACKGROUND

The present invention relates to valves, pumps, and actuators and more particularly to electrically controlled valves or pumps in which a fluid passage is controlled by selectively blocking a fluid opening or moving a wall. Devices of this type have found wide use in pneumatic or fluid control systems and elsewhere.

In general, valves of this type may operate in relatively mild environments, for example where the controlled fluid is atmospheric air at low pressures, or in more challenging environments in which the fluid is a process fluid or gas that is reactive or exists at greater pressure, or in which the valve itself is to be mounted in an assembly subject to heat, vibration or other physical challenge.

In general, for air at low pressure in applications such as HVAC pressure or flow control, and for numerous other fluid pumping, switching or pneumatic control applications, the overall structure of the valve involves a manifold or a specially-shaped housing, and a structure that is actuated to control a valve opening. For this purpose, a cantilevered member that actuates in a bending mode may be well suited to size or geometrical constraints of the valve/pump housing. Such a bender may be made using piezoelectric material. By way of example, U.S. Pat. No. 5,460,202 of Hanley et al shows such a device wherein the actuator element is formed of a metal shim with piezoceramic sheets on both sides which are energized in opposite senses to cause the element to bend. In that device, the bender element is clamped, with an insulating plastic layer, between two blocks to fix one end, and a voltage is applied through solder-attached electrical leads to bend the actuator so that the distal, non-clamped end moves along a direction normal to the plane of the bender.

A drawback in bending actuators of this type is that the repetitive bending actuation can cause cracking. Furthermore solder-connection of the metal shim or of the leads for energizing the piezo plates can damage the piezo material and also result in localized stresses that may break the solder joint. Further, clamping of the bender end, introduction of mounting holes, and exposure to fluids may all damage the bender.

Accordingly a valve or pump with a more robust and easily mounted bender actuation assembly would be desirable.

SUMMARY OF THE INVENTION

These and other desirable features are provided by an actuator for a valve, pump or the like, wherein an assembly is formed of two piezoelectric sheets sealed and juxtaposed for actuation in opposite senses to move an end of the assembly. The sheets are stacked, and inner faces of the first and second sheets of piezoelectric material are laminated to respective conductive lead paths on opposite faces of a polymer film or flex circuit, while the outer faces of the sheets of piezoelectric material are each covered by and electrically contacted to another flex circuit to produce a totally enclosed flat bender. The sheets and flex circuits are laminated together and at least a portion of the flex circuit extends away from the bender to provide a flexible and robust electrical connection thereto. The electrical connection is a flat ribbon-like strip of lesser thickness than the bender portion, and in a preferred embodiment the ribbon passes hermetically between a gasketed or sealed face and cover plate.

Unlike a conventional bender in which a metal strip lies on the neutral axis between two electroactive sheets, the middle layer of this construction may be an insulating film, and a narrow lead pattern on each side of the film provides an extended electrode contact path to each of the opposing piezo sheets while allowing the two sheets to act against each other through the film, thus achieving a high level of bending actuation.

The polymer film and flex circuits provide an essentially planar assembly which both insulates the piezo electric elements and allows them to be cantilevered from a housing with a simple flat clamping plate. The electrode paths may extend outside the clamped region and may for example, connect to a drive circuit, or may extend to and be laminated about one or more adjacent sets of piezo elements to form a strip assembly in which plural sets of piezo benders are flexibly attached by a ribbon of separately actuable conductive leads. Furthermore, holes may be punched in a region away from the electrodes, or in non-electrode areas to aid in registration or to accommodate through-bolts for mounting.

BRIEF DESCRIPTION OF THE DRAWINGS

These and other features of the invention will be understood from the description herein, together with drawings of an illustrative embodiment, wherein.

DETAILED DESCRIPTION

Figure 1:
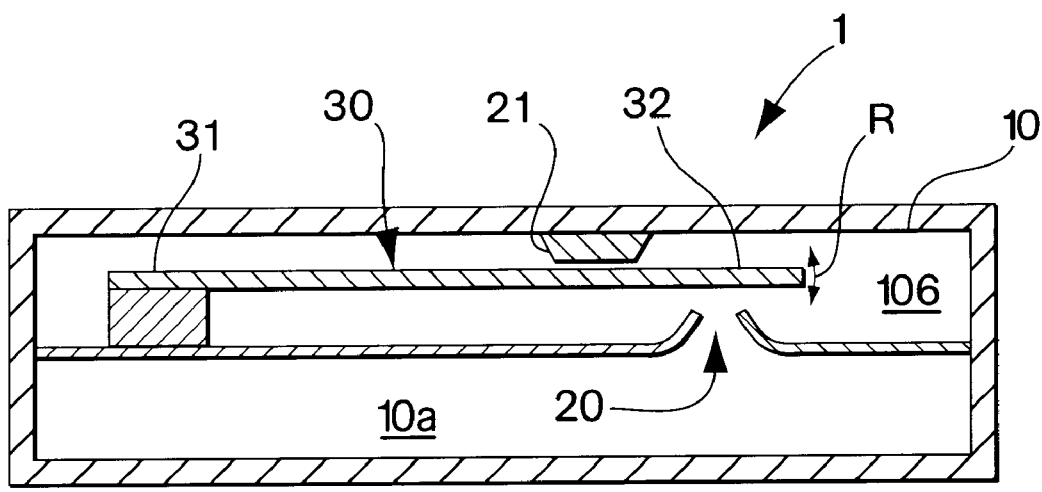
FIG. 1 is a schematic representation of the present invention.

FIG. 1 schematically illustrates a valve in accordance with the present invention, wherein a housing 10 includes a first compartment 10a and a second compartment 10b interconnected by an opening or orifice 20. A valve closure member 30 is suspended to selectively cover the orifice 20 or uncover the orifice allowing communications between the compartments 10a, 10b. The member 30 is shown as a cantilevered arm having a distal tip which closes the opening 20. While not shown in the figure, the compartments 10a, 10b may each be equipped with a inlet or outlet port, such as a tubing connector, or may otherwise be adapted to communicate with a pressurized environment or a source of fluid. By way of example, the valve 1 may be used for a ventilation control unit or an air temperature sensing unit, and may be adapted to intermittently allow fluid derived from one source or connection to communicate with another source or connection to perform a sensing or control function.

In accordance with a principle aspect of the present invention, the valve orifice 20 is closed by a member 30 which is a cantilevered arm that mounts to the housing at one end 31 and covers the opening at the other end 32. Motion of the arm is constrained by a stop 21 above and the aperture 20 to be within a narrow range R indicated by the bidirectional arrow at the end 32. Furthermore, member 30 is formed of a piezoceramic element enclosed within top and bottom sheets of material which provide electrode traces extending over its length and a uniform sheet of electrical insulation separating it from the surrounding environment. Member 30 is therefore a flat featureless package, and as described more fully below, the electroded enclosing sheets form a lead out-ribbon for actuating the member 30. While a single member 30 is shown in the housing, the invention further contemplates two or more such members, all connected between a common set of electroded sheets and actuated via a common end connector.

Figure 1A:
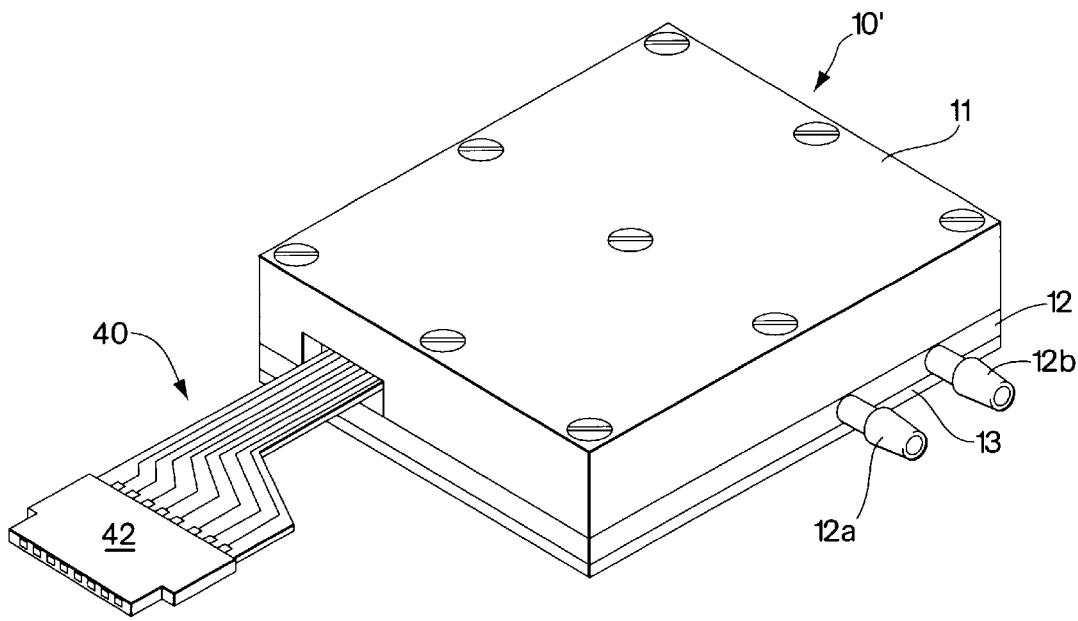
FIG. 1A is a perspective view from above of a valve and actuator assembly of the present invention.

FIG. 1A illustrates a practical embodiment of a valve in accordance with the present invention as schematically illustrated in FIG. 1. In this embodiment, the housing is comprised of three elements including a top cover 11, a manifold 12, and a bottom cover 13, which all fasten together to form a compartmented chamber in which a first port 12a and a second port 12b connect to the two different compartments within the housing. As shown, a set of conductive leads 40 extend outside of the housing to a multi-pin connector 42 which provides the drive voltage for the piezoelectric members. In the illustrated embodiment, the lower cover 13 is a flat plate which closes the bottom of manifold 12. Preferably a sheet of compressible gasket material (not shown) is provided between each junction.

Figure 2:
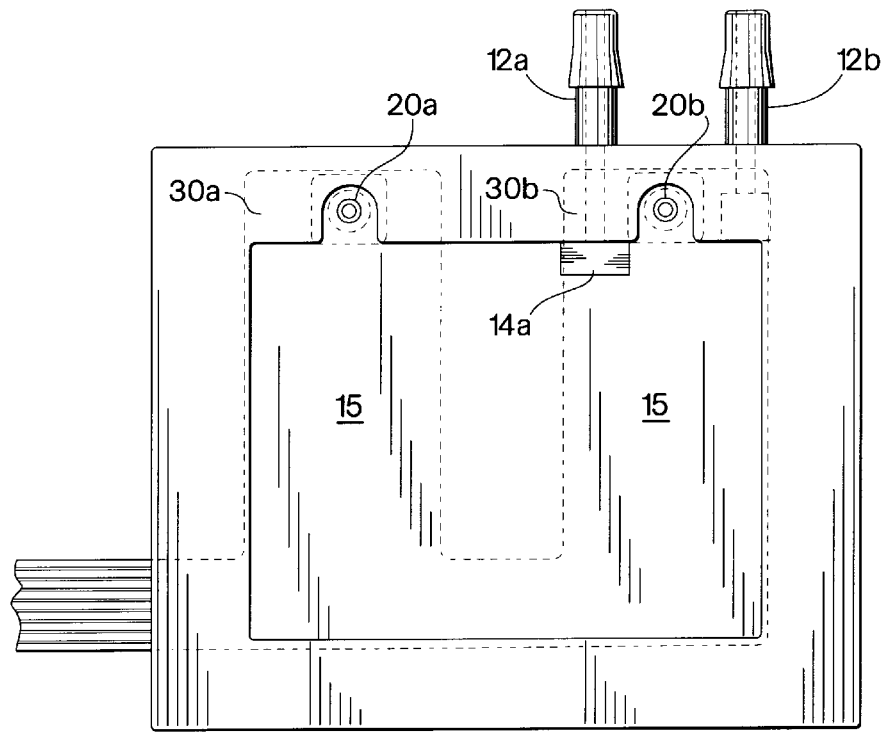
FIG. 2 is a bottom view of the assembly of FIG. 1.
Figure 3:
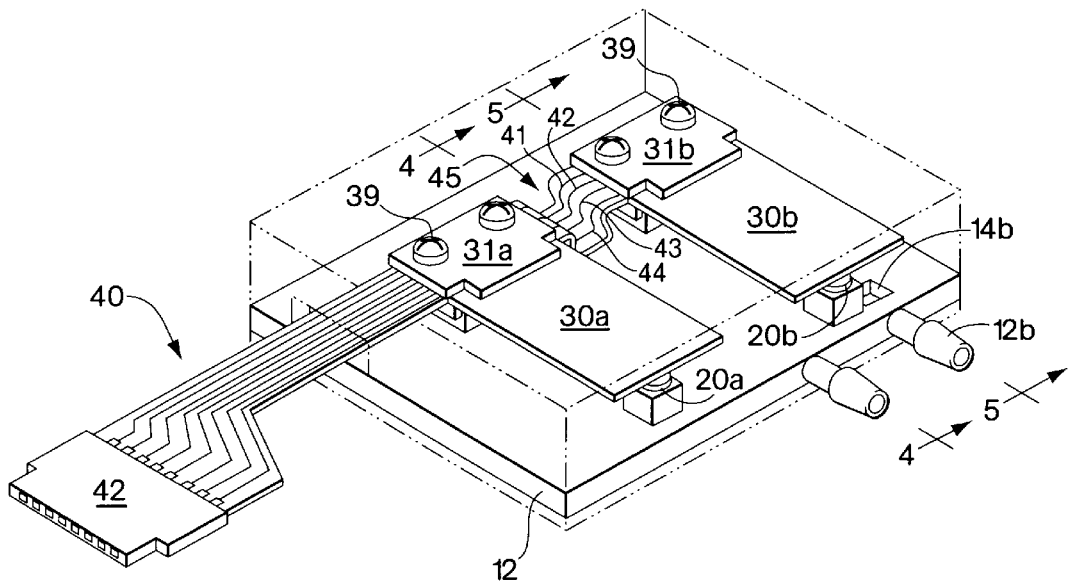
FIG. 3 is a view from the same perspective as FIG. 1 showing interior elements of the assembly.

The structure of manifold 12 in this representative embodiment will be better understood from FIGS. 2 and 3, which show respectively a plan view from the underneath side of manifold 12, and a perspective view from the top of the manifold with the covers 11, 13 shown in phantom. As shown therein, two elongated members, 30a, 30b are connected to the conductors 40 and are each clamped at one end by respective clamping plates 31a, 31b while the other end is cantilevered out and moves over a corresponding valve opening 20a, 20b. The openings 20a, 20b connect the upper portion or compartment of the valve with the lower portion or compartment of the valve. As also seen in FIG. 3, the port 12b connects via a through opening 14 to the upper compartment 10b. As most clearly visible in FIG. 2, the other port 12a connects via a similarly shaped but downwardly directed opening 14a to a recess denoted generally by 15 formed in the lower portion of the manifold. When the cover plate 13 is placed over the bottom of the manifold, recess 15 forms the lower chamber 10a (FIG. 1).

It will be understood that the members 30a, 30b are piezoelectric bender elements which move vertically, like diving boards, to cover and uncover the respective openings 20a, 20b. As shown, when either opening 20a or opening 20b is uncovered, the upper and lower compartment communicate with each other and port 12a is therefore placed in fluid communication with port 12b. Since the passages 14a, 14b are proximate both to the ports 12a, 12b and to the opening 20b, opening and closing of that aperture places the two ports in fairly direct communication with each other. Opening and closing aperture 20a on the other hand has a less immediate effect since any connection from one port to another is made via the distal end of closed recess 15, thus providing a longer communication path through a relatively shallow and extended chamber between the ports.

Figure 4:
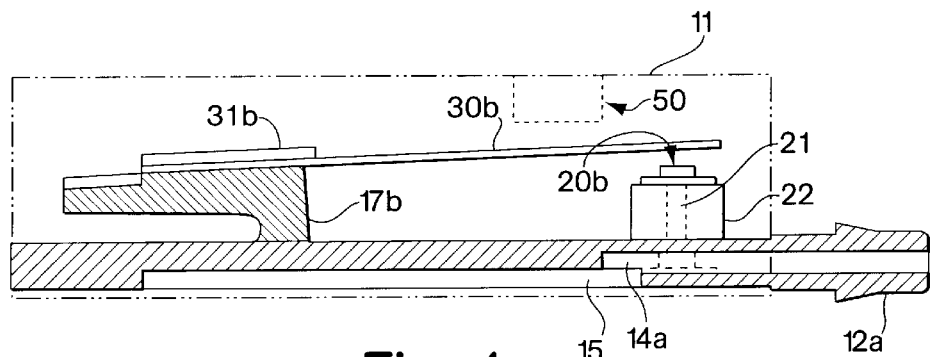
FIGS. 4 and 5 are sectional views thereof.
Figure 5:
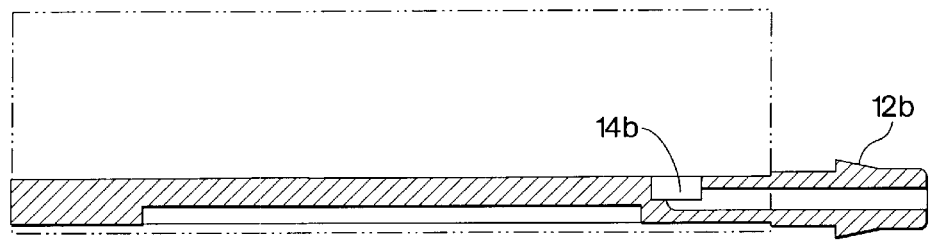

FIGS. 4 and 5 are vertical sections along the lines indicated in FIG. 3 through the center of the tubular passageways of the ports 12a, 12b respectively. As shown in FIG. 4, passage 14a opens directly into the lower space 15 corresponding to compartment 10a of FIG. 1, while port 12b opens directly via opening 14b into the upper portion. The upper and lower portions are connected by valve passage 21 leading to opening 20b. As further shown in FIG. 4, the member 30b is clamped to a base or stand 17b which may for example be an integral part of the manifold 12. Member 30b is held down by a clamp plate 31b which is a generally planar sheet.

As best seen in FIG. 3, the members 30a, 30b are parts of a common laminated sheet assembly of which the lead-in conductors 40 are also a portion. The conductors 40, formed by opposed flex circuits joined together in a laminated stack, attach to various surfaces of the members 30a, 30b as described more fully below in reference to FIG. 6. Half of the electrode elements extend to member 30a, while the other half, visible as conductive leads 41, 42, 43 . . . , extend to member 30b, so that each member may be separately actuated by appropriate ones of the conductors at the pin connector 42. As further shown in FIG. 3, the flex circuits which are joined together to form a ribbon connector 40 extending to the multi-pin socket 42 at one side, also form a flexible ribbon-like set of lead-in electrodes 45 between member 30a and member 30b, which as shown is bent to allow the members 30a, 30b to be positioned at an arbitrary spacing and alignment which respect to each other within the housing.

As noted above, each of the elements 30a, 30b once clamped down by its respective clamp plate 31a, 31b is capable of undergoing only a limited range of motion indicated by arrow R in FIG. 1. As shown schematically in FIG. 4, an upper limit stop 50, which may form part of the cover 11, can be provided to limit the upward motion of each member 30. A projection 22 extending upward from the manifold 12 and containing the passage 21 and aperture 20a or 20b effectively limits downward motion of each member. The actuating members 30 are preferably fabricated in the manner taught by commonly owned U.S. patent application Ser. No. 08/188,145, filed on Jan. 27, 1994 and by applicant's corresponding PCT filing which has been published as International Application WO 95/20827. Both of these patent applications are hereby incorporated herein by reference in their entirety. Briefly, each element 30a or 30b is fabricated by laminating two piezoceramic sheets between a set of three flex circuits which collectively form electrode contacts on the top and bottom of each piezoceramic sheet. A single two-sided flex circuit lies in the middle between upper and lower piezoceramic sheets, and bending actuation is effected by applying a voltage across the upper and lower sheets so they are actuated in opposite senses and bend together with the two-sided flex circuit lying between them. Thus, each member 30a, 30b acts a piezo bender to actively close or open the valve orifice 20a or 20b beneath it. As taught in the aforesaid U.S. and international patent applications, the flex circuits and piezoceramic sheets are laminated together with a highly cross-linkable curable epoxy or similar structural material to form a unitary block in which an electrode trace on each flex circuit makes dependable contact along an electrode path which extends substantially entirely across or along each of the piezo sheets. The lamination is preferably performed under heat and pressure, for example with a heated press, such that the electrode traces, upon cooling, exert a tensile stress binding the sheets to resist cracking, without unduly restraining their in-plane actuation.

Figure 6:
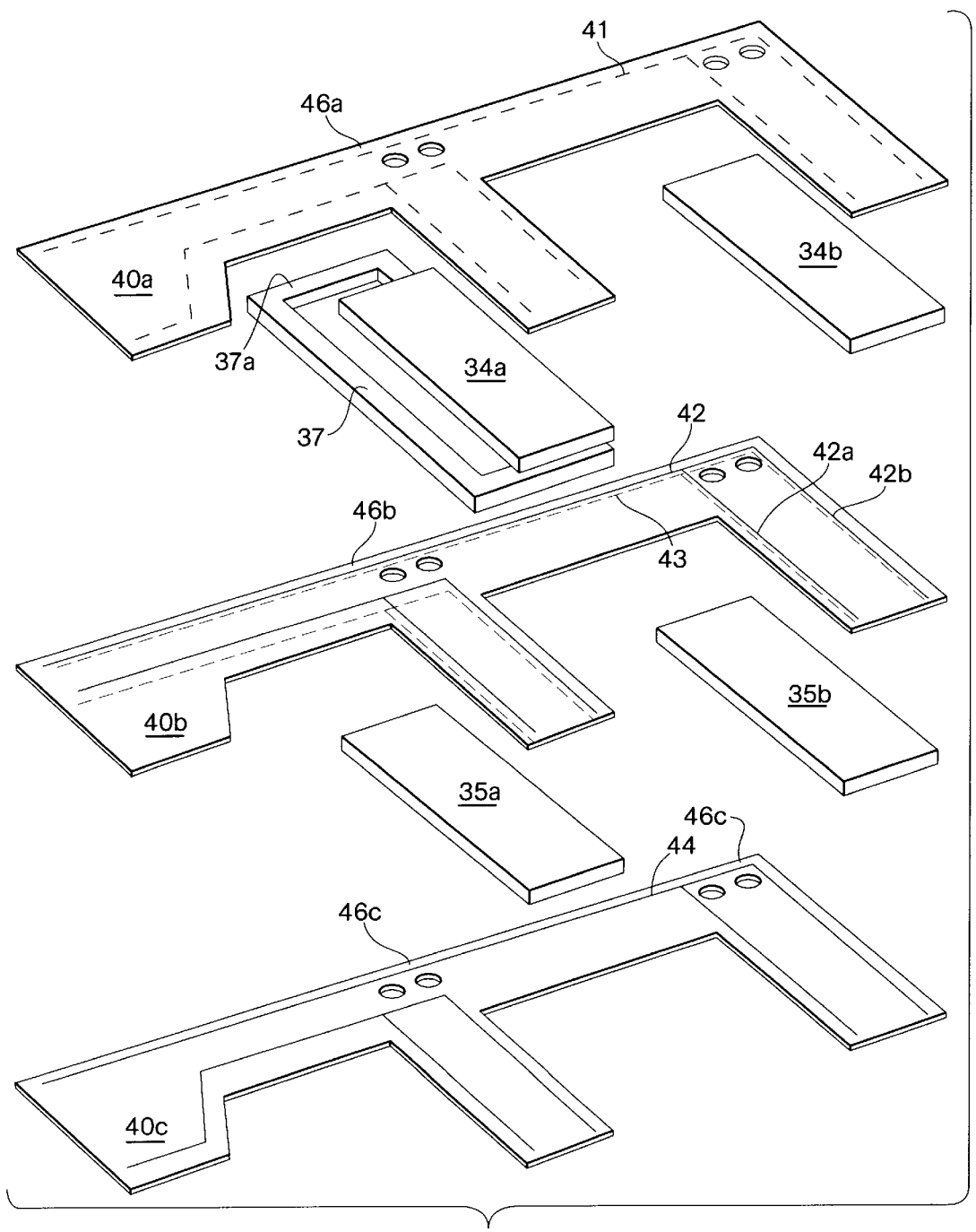
FIG. 6 is a perspective exploded view showing layer structure of the actuator elements.

FIG. 6 illustrates the general construction of the actuator elements 30a, 30b in the embodiment illustrated in FIGS. 2–5. In this exploded view, the conductor portion 40 is seen to be composed of three flex circuits 40a, 40b and 40c each of identical shape but having different electrode patterns, which as discussed further below, extend to the upper and lower surfaces of each of two piezoceramic sheets making up each of the two members 30a, 30b with a total of eight electrode leads in all. As shown, each of the flex circuit films has roughly the shape of the letter F, and each member 30a, 30b is formed by laminating a corresponding pair of piezoceramic sheets 34a, 35a, or 34b, 35b, respectively, between the extending arms of the three flex circuits. As further shown in the exploded view FIG. 6, a frame element 37 is fitted around each of the piezoceramic sheets. Only one of these elements is shown, but it will be understood that a similar element is provided for each of the other three piezoceramic sheets, 34b, 35a, 35b. Each of the frame elements is made of a polymer having a thickness dimension approximating or somewhat less than that of the piezoceramic sheets and having a cutout approximately the size of the sheets for receiving each sheet in a recess formed therein.

As illustrated generally in FIG. 6, the piezoceramic sheets are each placed within a frame member 37 and the upper and lower flex circuits 40a, 40b or 40b, 40c respectively are all placed about the piezo plates and assembled together by heat and pressure to form the unit 40, 30a, 30b as illustrated in FIG. 3. Further details of construction are given in the aforesaid patent applications. By way of example, for a prototype embodiment, flex circuit 40a, flex circuit 40b and flex circuit 40c were each formed of a polyimide or similar stiff polymer having a thickness of approximately one mil (0.025 millimeters) while the conductive leads appearing thereon were formed of a high tensile strength copper foil having a thickness of approximately 1.4 mils that, in some embodiments, was adhered to the polymer sheet by a one mil adhesive layer. A curable epoxy bonding layer approximately the thickness of the electrode layer was used to couple the flex circuit to the surface of the piezo sheets. Each of the piezoceramic sheets 34a, 35a had a thickness of approximately 7.75 mils, while the spacer 37 had a thickness of approximately 5 mils and was somewhat deformable or flowable at the lamination temperatures employed. The material of frame 37 was selected to be compatible with the polymer of the flex circuit films 40a, 40b, 40c and with the epoxy bonding material so that they would seal the edges of the piezo ceramic sheets and, together with the sheets and flex circuits, form a unitized and unitary stiff but flexible laminated sheet assembly. As further shown in FIG. 6, each of the electrodes, of which electrode 42 is specifically numbered, bifurcates or diverges into several prongs 42a, 42b . . . which extend along substantially the full length of the corresponding piezoceramic element, ie, 34b, thus providing a set of elongated conductive metal traces which provide a tensile support or binding of the piezo sheet and add strength while delivering electric charge to the full sheet. Each of the piezo ceramic sheets, while not expressly illustrated, preferably has a sputter-deposited or similar metalized electrode layer on each surface which is contacted by the electrode traces 41, 42 . . .

As further shown in FIG. 6, both the component flex circuits 40a, 40b and 40c as well as the frame elements 37 extend with a band 46 or 37a away from the members or piezoceramic sheets 34, 35 to provide a continuous extension region free of included electrode or piezo material. This region allows mounting holes or alignment notches to be punched through the laminated assembly without damaging piezoceramic sheets or the conductive leads 41, 42 . . . Thus, in addition to being placed at arbitrary spacing or alignment as shown in FIG. 3, the actuator assembly and flex circuit attachment may be punched or notched in various ways to assure accurate alignment of the individual members 30 in the housing.

In this embodiment, the members 30, 40 form an assembly under thirty mils thick, in which the actuator portions 30 are readily clamped flat and aligned at various positions so as to selectively cover or uncover the apertures 20a, 20b.

Advantageously by being sealed entirely between three flex circuits, the two sets of piezoceramic plates are both electrically insulated from their surroundings, and protected against gas or fluid-born reactants in the environment. This advantageously renders the piezoceramic sheets exceptionally stable over time. It will further be understood that normally sheets of such thin dimension and relatively large surface area would be prone to various interactions with the surrounding atmosphere, or, in the presence of exotic atmospheres, to degradation. These effects are mitigated or overcome by sealing within the flex circuits and flowable frame 37. Furthermore, because a major portion of the strength of the assembly derives from the high tensile flex circuit elements and the epoxy bonding material joining them together, the end support region provided by band 36 and ends 37a of the frames 37 provides a flat and hardy clamping region which dependably supports the piezo plates in perfect alignment without subjecting them to malfunction or destructive compression when the assembly is clamped. This construction is believed to constitute a notable advance over conventional piezo bender elements which act against a stiff metal shim between them, or constructions wherein the piezo sheets themselves constitute the major body of the actuator and must therefore be carefully clamped, require separate insulation, and are vulnerable to wear and degradation.

Indeed, the invention further contemplates a construction wherein a single piezoceramic sheet is laminated to a thin metal sheet on one surface, and to a flex circuit having thin electrode traces on its opposite surface, so that the piezoceramic is sealed between the metal foil and flex circuit. In this embodiment, rather than having a shim located at the neutral axis of the structure, the piezo acts against the inextensible off-axis metal layer to achieve highly efficient bending actuation. As in the previously-described embodiment, a frame element 37 (FIG. 6) is preferably provided to position and seal the piezo within the surrounding enveloped formed of the shim and flex circuit.

Furthermore, the ribbon conductor, lead-in or connecting portion advantageously allows field assembly and alignment, and permits a hermetic seal while passing through a gasket or, in the field, by simple caulking or sealing during assembly or repair.

It will be understood that the foregoing specific example is given by way of illustration only and is not intended to limit the invention. Indeed, where the valve requires it, three, four or more actuator elements $30_i$ may be fabricated together between a common set of flex circuits and led out to a common pin connector, to several separate connectors, or to other electrical connectors for circuit contact with a sensing or drive circuit. Furthermore, the shape of the flex circuits may be made to conform to an arbitrary valve housing, such as a curve to fit the circular shape commonly used on thermostatic controls, or any other shape. The invention being thus described and disclosed with respect to specific embodiments, further variations and modifications will occur to those skilled in the art, and all such variations and modifications are considered to lie within the scope of the invention, as defined by the claims appended hereto and equivalents thereof.

What is claimed is:

1. A valve assembly comprising
   a housing having a fluid opening for allowing fluid passage therethrough; and
   a piezoelectric plate assembly including at least first and second piezoceramic sheets actuated by electrodes to form a bender, with a first end of the plate assembly positioned to selectively block the opening when the plate assembly bends wherein the piezoceramic sheets are laminated between flex circuits and the flex circuits include an elongated conductive electrode trace being laminated to and providing tensile support of the sheets while solderlessly electrically contacting said surfaces and maintaining electrical connection over the sheets as the sheets bend to open and close the opening.

2. A valve assembly according to claim 1, wherein said piezoelectric plate assembly has a second end attached to said housing.

3. A valve assembly according to claim 1, wherein said plate assembly constitutes a flat sheet such that a second end of the plate assembly is clamped to fix an end of the bender without cracking said sheets or delaminating the electrode traces.

4. A valve assembly according to claim 1, wherein said flex circuits electrically isolate the piezoceramic plate assembly from the surrounding environment.

5. A valve assembly according to claim 1, wherein said flex circuits provide environmental protection for the piezoceramic sheets.

6. A valve assembly according to claim 1, wherein said flex circuits include a tensile foil electrode layer to bind the piezoceramic sheets to maintain integrity of the bender in the event of piezoceramic fracturing.

7. A valve assembly according to claim 1, wherein said piezoelectric plate assembly includes at least one of alignment holes and notches which extend through the assembly without contacting the piezoceramic sheets.

8. A valve assembly according to claim 1, wherein said bender is constrained in movement along a portion of its length.

9. A valve assembly according to claim 1, further comprising third and fourth sheets of piezoceramic material laminated between said flex circuits to bend when voltage on the flex circuit faces energizes the sheets to create motion, said third and fourth sheets forming a second bender flexibly connected to said plate assembly by said flex circuits.

10. A valve assembly according to claim 1, comprising plural orifices and plural pairs of piezoceramic sheets, each of the plural pairs forming a bender over a respective one of said orifices and being spaced from others of said pairs to form adjacent benders, and at least one of the flex circuits includes electrically conductive paths for separately energizing each of the benders.

11. A valve assembly according to claim 10, wherein the flex circuits are deformable between adjacent benders thereby allowing independent alignment of the separate benders.

12. A valve assembly according to claim 10, wherein the flex circuits extend between benders such that benders are sealed in separate compartments of the housing.

13. A valve assembly according to claim 1, wherein the piezoceramic sheets form a shimless bender, and a plurality of electrodes on the flex circuit provide independent electrical control over each face of each piezoceramic sheet.

14. A valve assembly according to claim 1, wherein the piezoelectric plate assembly clamps and bends without breakage and is self-insulating.

15. A piezoceramic bender comprising first and second sheets of piezoceramic material and a flex circuit for applying electrical potential across said sheets of piezoceramic, said flex circuit being located between the first and second sheets such that the first and second sheets act against each other through the flex circuit to create bending and the flex circuit includes conductor paths that are elongated traces that extend across said sheets on faces of a polymer film providing tensile support against cracking and maintaining electrical contact with substantially the full sheets as the bender bends.

16. A low profile valve actuator comprising a piezo bender formed of first and second opposed piezoceramic sheets and a plurality of flex circuits having thin conductive paths extending along the faces of the opposed piezoceramic sheets for establishing electrical fields across each of said sheets, wherein the flex circuits are laminated to the sheets and the thin conductive paths extend across the sheets, to seal against tensile cracking while maintaining electrical connection to substantially the full sheets.

17. A low profile valve actuator according to claim 16, wherein one of said flex circuits extends in a neutral plane between said piezoceramic sheets.

18. A valve assembly comprising a housing having a fluid opening for allowing fluid passage therethrough; and a piezoelectric plate assembly including at least one piezoceramic sheet actuated by electrodes, with a first end of the plate assembly positioned to selectively block the opening when the plate assembly bends wherein the piezoceramic sheet is laminated between a metal shim and a flex circuit and the flex circuit has electrode traces which extend over and contact a surface of the piezoceramic sheet sealing against tensile cracking while solderlessly electrically contacting the surface and maintaining contact over the sheet as the sheet bends to open and close the opening.

* * * * *